United States Patent
Kim et al.

(10) Patent No.: US 12,451,371 B2
(45) Date of Patent: Oct. 21, 2025

(54) SUBSTRATE PROCESSING APPARATUS AND SUBSTRATE PROCESSING METHOD

(71) Applicant: SEMES CO., LTD., Cheonan-si (KR)

(72) Inventors: Kang Sul Kim, Cheonan-si (KR); Tae-Keun Kim, Cheonan-si (KR); Junhee Choi, Cheonan-si (KR); Kyeong Min Lee, Cheonan-si (KR); Yong Jun Kim, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 18/495,180

(22) Filed: Oct. 26, 2023

(65) Prior Publication Data

US 2024/0178009 A1    May 30, 2024

(30) Foreign Application Priority Data

Nov. 30, 2022   (KR) .................. 10-2022-0164390

(51) Int. Cl.
*H01L 21/67*   (2006.01)
*H01L 21/02*   (2006.01)

(52) U.S. Cl.
CPC .... *H01L 21/67028* (2013.01); *H01L 21/6715* (2013.01); *H01L 21/02057* (2013.01); *H01L 21/67017* (2013.01); *H01L 21/67051* (2013.01)

(58) Field of Classification Search
CPC .............. H01L 21/67017–67086; H01L 21/02041–02101
See application file for complete search history.

(56) References Cited

U.S. PATENT DOCUMENTS 6,642,142 B2   11/2003   Nagai et al.
10,714,352 B2   7/2020   Park et al.
(Continued)

FOREIGN PATENT DOCUMENTS

JP   2002-0329697 A   11/2002
JP   2015126194 A  *  7/2015
(Continued)

OTHER PUBLICATIONS

"Supply," Merriam-Webster Dictionary, retrieved from https://www.merriam-webster.com/dictionary/supply (Year: 2025).*
(Continued)

*Primary Examiner* — Kaj K Olsen
*Assistant Examiner* — Richard Z. Zhang
(74) *Attorney, Agent, or Firm* — Harness, Dickey & Pierce, P.L.C.

(57) ABSTRACT

Disclosed are a substrate processing apparatus that allow a chemical liquid to penetrate deeply into a gap between patterns of a substrate. The substrate processing apparatus includes a housing having a processing space defined therein in which a substrate is processed; a substrate support installed in the processing space so as to be rotatable about a rotation axis and configured to support the substrate; a chemical liquid supply disposed on top of the substrate support and configured to spray a chemical liquid toward an upper surface of the substrate supported on the substrate support; and a controller configured to repeatedly apply a first rotation control signal and a second rotation control signal indicating different rotation speeds to the substrate support so as to generate an inertial behavior of the chemical liquid coated on the substrate.

17 Claims, 12 Drawing Sheets

(56) References Cited

U.S. PATENT DOCUMENTS

| | | |
|---|---|---|
| 10,998,183 B2 | 5/2021 | Kaneko et al. |
| 2009/0151754 A1 | 6/2009 | Zhu et al. |
| 2015/0128994 A1* | 5/2015 | Kaneko ............. H01L 21/67051 134/4 |
| 2017/0043379 A1 | 2/2017 | Sasaki et al. |
| 2018/0061649 A1* | 3/2018 | Park .................. H01L 21/30604 |
| 2020/0194281 A1 | 6/2020 | Yoshida et al. |
| 2022/0230873 A1* | 7/2022 | Mei ................... H01L 21/02087 |

FOREIGN PATENT DOCUMENTS

| | | |
|---|---|---|
| KR | 10-2010-0100969 A | 9/2010 |
| KR | 10-2017-0020227 A | 2/2017 |
| KR | 10-2018-0025450 A | 3/2018 |
| KR | 101874526 B1 | 7/2018 |
| KR | 10-2020-0074024 A | 6/2020 |
| KR | 10-2022-0095023 A | 7/2022 |

OTHER PUBLICATIONS

"Support," Merriam-Webster Dictionary, https://www.merriam-webster.com/dictionary/support (Year: 2025).*

* cited by examiner

| Before processing | After processing |
|---|---|
|  |  |
| 20729 counts | 208 counts |
| Removal percentage 99% ||

Gap Fill 50~60%

FIG. 10

| Before processing | After processing |
|---|---|
| | |
| 22425 counts | 1179 counts |
| Removal percentage 94% ||

SUBSTRATE PROCESSING APPARATUS AND SUBSTRATE PROCESSING METHOD

CROSS-REFERENCE TO RELATED PATENT APPLICATION

This application claims the benefit of Korean Patent Application No. 10-2022-0164390, filed on Nov. 30, 2022, in the Korean Intellectual Property Office, the disclosure of which is incorporated herein in its entirety by reference.

BACKGROUND OF THE DISCLOSURE

1. Field of the Disclosure

The present disclosure relates to a substrate processing apparatus and a substrate processing method. More specifically, the present disclosure relates to a substrate processing apparatus that allows a chemical liquid to penetrate deeply into a gap between patterns provided on a wafer, and a substrate processing method using the same.

2. Description of the Related Art

A semiconductor device is manufactured through several steps, including a diffusion process, a photo process, an etching process, and a deposition process. In this regard, a cleaning process is performed between adjacent ones of the diffusion process, the etching process, and the polishing process.

In recent years, as technology has become more advanced such that a substrate pattern becomes finer, the cleaning process is an important process to improve a yield of the semiconductor device. The cleaning process may remove impurities on a substrate surface via chemical substance treatment, gas supply, and physical scheme.

For this cleaning process, various types of chemical liquids may be used. A concentration and a temperature of the chemical liquid may be adjusted in a chemical liquid supply apparatus before the chemical liquid is sprayed onto the substrate. The chemical liquid is sprayed onto a center of the substrate, and then flows to an outer area thereof under a centrifugal force of a rotating substrate, and penetrates between patterns of the substrate.

However, in this scheme, when the chemical liquid flows into between the patterns of the substrate, resistance applied to the chemical liquid increases as the chemical liquid flows toward a wall of the pattern, such that a penetration depth of the chemical liquid is limited. Therefore, it is difficult to remove impurities near and at a bottom of the pattern, and this problem becomes more severe when a spacing between the patterns of the substrate is smaller, or when the pattern is formed as a hole pattern.

SUMMARY OF THE DISCLOSURE

The present disclosure is intended to solve several problems, including the above-mentioned problems. A purpose of the present disclosure is to provide a substrate processing apparatus and a substrate processing method in which a damage to the substrate due to physical or chemical schemes may be suppressed, and the chemical liquid can penetrate deeply into a gap between the patterns of the substrate during the cleaning process.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means illustrated in the claims and combinations thereof.

According to one aspect of the present disclosure, a substrate processing apparatus is provided. The substrate processing apparatus comprises a housing having a processing space defined therein in which a substrate is processed; a substrate support installed in the processing space so as to be rotatable about a rotation axis and configured to support the substrate; a chemical liquid supply disposed on top of the substrate support and configured to spray a chemical liquid toward an upper surface of the substrate supported on the substrate support; and a controller configured to repeatedly apply a first rotation control signal and a second rotation control signal indicating different rotation speeds to the substrate support so as to generate an inertial behavior of the chemical liquid coated on the substrate due to change in a rotation speed of the substrate support in a process of coating the chemical liquid on the substrate.

In one implementation of the substrate processing apparatus, the controller is configured to: apply the first rotation control signal to the substrate support to allow the substrate support to rotate at a first rotation speed; and apply the second rotation control signal to the substrate support while the rotation of the substrate support is not stopped to allow the substrate support to rotate at a second rotation speed different from the first rotation speed.

In one implementation of the substrate processing apparatus, the controller is configured to periodically and repeatedly apply the first rotation control signal and the second rotation control signal at a regular interval.

In one implementation of the substrate processing apparatus, a difference between the first rotation speed and the second rotation speed is in a range of 500 rpm to 750 rpm.

In one implementation of the substrate processing apparatus, the first rotation speed is in a range of 1500 rpm to 2000 rpm.

In one implementation of the substrate processing apparatus, the second rotation speed is in a range of 750 rpm to 1500 rpm.

In one implementation of the substrate processing apparatus, the controller is configured to apply the first rotation control signal for a first time, and then apply the second rotation control signal for a second time.

In one implementation of the substrate processing apparatus, the first time and the second time are equal to each other.

In one implementation of the substrate processing apparatus, each of the first time and the second time is in a range of 1 second to 5 seconds.

According to another aspect of the present disclosure, a substrate processing method is provided. The substrate processing method uses a substrate processing apparatus, wherein the substrate processing apparatus includes: a housing having a processing space defined therein in which a substrate is processed; a substrate support installed in the processing space so as to be rotatable about a rotation axis and configured to support the substrate; a chemical liquid supply disposed on top of the substrate support and configured to spray a chemical liquid toward an upper surface of the substrate supported on the substrate support; and a controller configured to repeatedly apply a first rotation control signal and a second rotation control signal indicating different rotation speeds to the substrate support so as to generate an inertial behavior of the chemical liquid coated on the substrate due to change in a rotation speed of the substrate support in a process of coating the chemical liquid on the substrate. The method comprises: a substrate loading step in which the substrate is loaded onto and supported on the substrate support in the processing space of the housing; and a chemical liquid coating step of spraying the chemical liquid toward the upper surface of the substrate and coating the chemical liquid on the substrate by rotating the substrate while changing a rotation speed of the substrate to different rotation speeds.

In one implementation of the substrate processing method, the chemical liquid coating step includes: applying the first rotation control signal to the substrate support to allow the substrate support to rotate at a first rotation speed; and applying the second rotation control signal to the substrate support while the rotation of the substrate support is not stopped to allow the substrate support to rotate at a second rotation speed different from the first rotation speed.

In one implementation of the substrate processing method, the chemical liquid coating step includes periodically and repeatedly applying the first rotation control signal and the second rotation control signal at a regular interval.

In one implementation of the substrate processing method, the chemical liquid coating step includes maintaining a difference between the first rotation speed and the second rotation speed in a range of 500 rpm to 750 rpm.

In one implementation of the substrate processing method, the chemical liquid coating step includes maintaining the first rotation speed in a range of 1500 rpm to 2000 rpm.

In one implementation of the substrate processing method, the chemical liquid coating step includes maintaining the second rotation speed in a range of 750 rpm to 1500 rpm.

In one implementation of the substrate processing method, the chemical liquid coating step includes applying the first rotation control signal for a first time, and then applying the second rotation control signal for a second time.

In one implementation of the substrate processing method, the first time and the second time are equal to each other.

In one implementation of the substrate processing method, each of the first time and the second time is in a range of 1 second to 5 seconds.

In one implementation of the substrate processing method, the substrate processing method further comprises: after the chemical liquid coating step, peeling off the chemical liquid coated on the substrate to remove particles physically attached to an area of the substrate; and cleaning the substrate from which the chemical liquid has been peeled off; and drying the cleaned substrate.

According to still another aspect of the present disclosure, a substrate processing method is provided. The substrate processing method uses a substrate processing apparatus, wherein the substrate processing apparatus includes: a housing having a processing space defined therein in which a substrate is processed; a substrate support installed in the processing space so as to be rotatable about a rotation axis and configured to support the substrate; a chemical liquid supply disposed on top of the substrate support and configured to spray a chemical liquid toward an upper surface of the substrate supported on the substrate support; and a controller configured to repeatedly apply a first rotation control signal and a second rotation control signal indicating different rotation speeds to the substrate support so as to generate an inertial behavior of the chemical liquid coated on the substrate due to change in a rotation speed of the substrate support in a process of coating the chemical liquid on the substrate. The method comprises: a substrate loading step in which the substrate is loaded onto and supported on the substrate support in the processing space of the housing; and a chemical liquid coating step of spraying the chemical liquid toward the upper surface of the substrate and coating the chemical liquid on the substrate by rotating the substrate while changing a rotation speed of the substrate to different rotation speeds, wherein the chemical liquid coating step includes; applying the first rotation control signal to the substrate support to allow the substrate support to rotate at a first rotation speed; and applying the second rotation control signal to the substrate support while the rotation of the substrate support is not stopped to allow the substrate support to rotate at a second rotation speed different from the first rotation speed, wherein the chemical liquid coating step includes periodically and repeatedly applying the first rotation control signal and the second rotation control signal at a regular interval, wherein the chemical liquid coating step includes maintaining a difference between the first rotation speed and the second rotation speed in a range of 500 rpm to 750 rpm, wherein the chemical liquid coating step includes maintaining the first rotation speed in a range of 1500 rpm to 2000 rpm, and maintaining the second rotation speed in a range of 750 rpm to 1500 rpm, wherein the chemical liquid coating step includes applying the first rotation control signal for a first time, and then applying the second rotation control signal for a second time, wherein the first time and the second time are equal to each other, wherein each of the first time and the second time is in a range of 1 second to 5 seconds, wherein the substrate processing method further comprises: after the chemical liquid coating step, peeling off the chemical liquid coated on the substrate to remove particles physically attached to an area of the substrate; and cleaning the substrate from which the chemical liquid has been peeled off; and drying the cleaned substrate.

According to the aspects and the implementations of the present disclosure as described above, the inertial behavior of the chemical liquid coated on the upper surface of the substrate may be generated such that the chemical liquid can penetrate deeply into the gap between the patterns without damaging the patterns formed on the substrate. Accordingly, the substrate processing apparatus and the substrate processing method that may efficiently remove the impurities near and at the bottom of the pattern may be realized.

In addition, the processing efficiency and quality of the substrate may be increased by efficiently performing the substrate cleaning process. This may reduce the cost and time occurring due to defective patterns of the substrate.

Effects of the present disclosure are not limited to the effects mentioned above, and other effects not mentioned will be clearly understood by those skilled in the art from the descriptions below.

BRIEF DESCRIPTION OF THE DRAWINGS

The above and other purposes, features and other advantages of the present disclosure will be more clearly understood from the following detailed description taken in conjunction with the accompanying drawings, in which:

FIG. 9 to FIG. 11 are images showing results of removing particles attached to the substrate therefrom using a substrate processing method according to a comparative example of the present disclosure.

DETAILED DESCRIPTION OF THE DISCLOSURE

Figure 1:
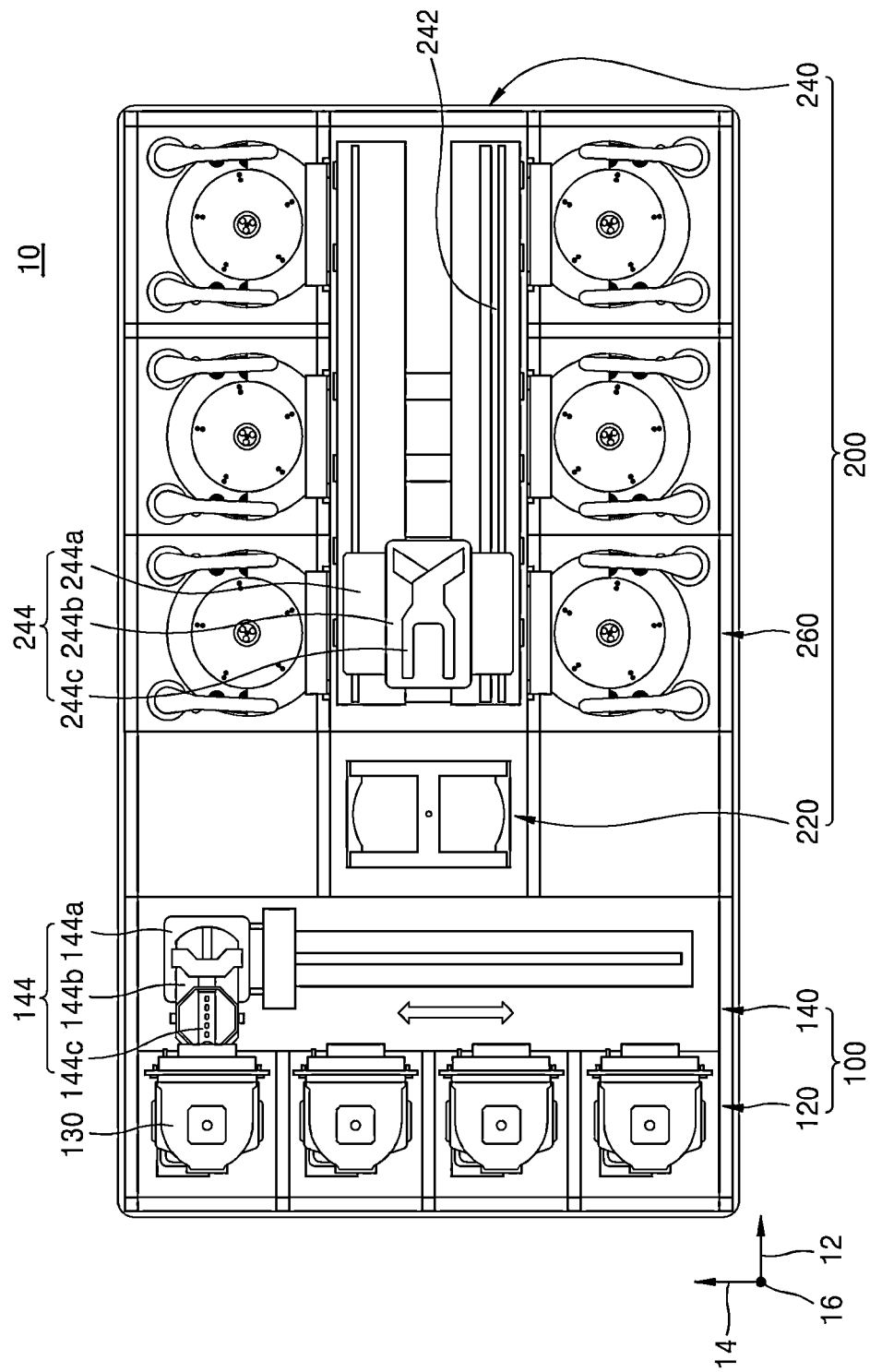
FIG. 1 is a schematic plan view showing a substrate processing facility according to an embodiment of the present disclosure.

Hereinafter, various preferred embodiments of the present disclosure will be described in detail with reference to the attached drawings.

The embodiments of the present disclosure are provided to more completely describe the present disclosure for those skilled in the art. The following embodiments may be modified in various forms, and the scope of the present disclosure is not limited to the following embodiments. Rather, these embodiments are provided so that the present disclosure is thorough and complete, and are provided to fully convey the spirit of the present disclosure to those skilled in the art. Furthermore, a thickness or a size of each layer in the drawing is exaggerated for convenience and clarity of illustration. A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof.

Hereinafter, embodiments of the present disclosure will be described with reference to drawings schematically showing ideal embodiments of the present disclosure. In the drawings, variations of a depicted shape may be expected, depending, for example, on manufacturing techniques and/or tolerances. Therefore, the embodiments of the present disclosure should not be construed as being limited to the specific shape of the area shown herein, and should include, for example, change in a shape caused in a manufacturing process.

Figure 12:
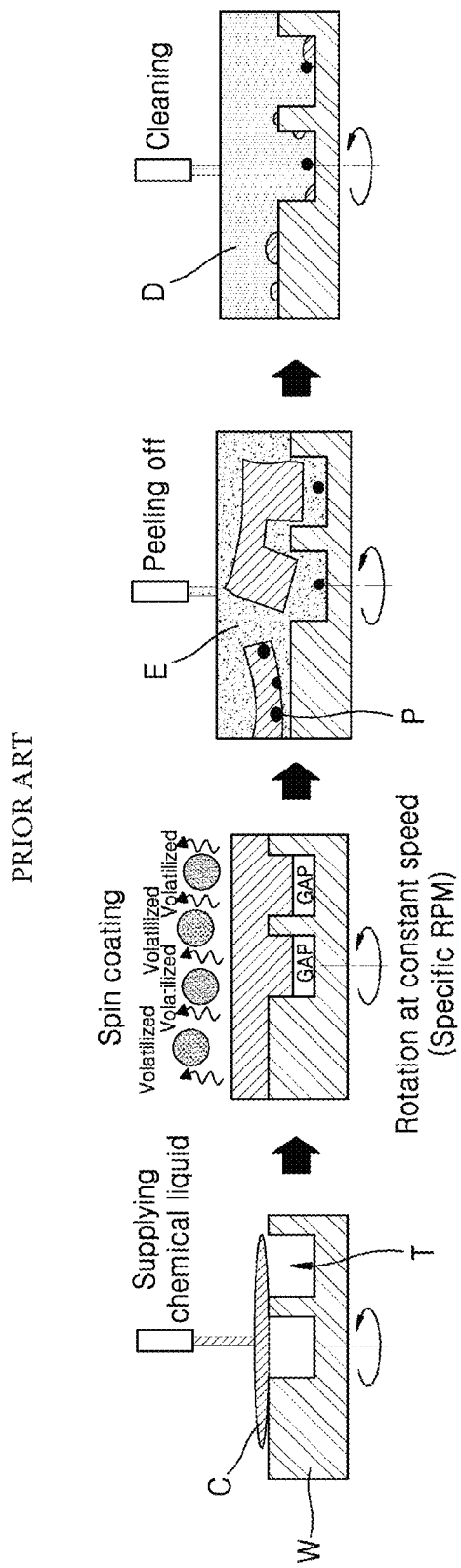
FIG. 12 is a diagram for illustrating a conventional substrate cleaning method.

FIG. 12 is a diagram for illustrating a conventional substrate cleaning method.

First, referring to FIG. 12, in a conventional substrate cleaning apparatus, particle removal is performed using physical force or a chemical action of a chemical liquid. However, in these schemes, there is a risk that a pattern T formed on a surface of a substrate W may be damaged by the physical force, or that an underlying film of the substrate W may eroded under an etching effect.

Specifically, the substrate W is placed on a chuck, and a chemical liquid C is discharged toward the substrate W while rotating the substrate W having particles P attached thereto. The chemical liquid C contains a volatile component, and may be embodied as a processing liquid for film formation to form a top coat film on the substrate W. The processing liquid forms a protective film applied to an upper surface of a resist film to prevent an immersion fluid from invading into the resist film. The immersion fluid is, for example, a liquid used for liquid immersion exposure in a lithography process. However, a type of the chemical liquid C is not limited to the above embodiment.

The chemical liquid C is simply discharged toward a center of the substrate W. As the substrate W rotates, the chemical liquid C flows to an outer area under a centrifugal force, and fills a gap between patterns T formed on the substrate W. In this regard, when a rotation speed of the substrate W is constant, the centrifugal force increases as a position is displaced towards the outer edge of the substrate W. Thus, a phenomenon in which the chemical liquid C is concentrated towards the outer area of the substrate W occurs. In addition, due to the stronger centrifugal force, the chemical liquid C may not sufficiently fill the gap between the patterns T in the inner area of the substrate.

In particular, when the substrate W rotates, the rotation speed is maintained at a constant speed, so that a phenomenon in which the chemical liquid C does not penetrate deeply into the gap between the patterns T formed on the substrate W occurs. While a gap is generated between a bottom level of the gap between the patterns T and the chemical liquid C, the volatile component contained in the chemical liquid C is volatilized and removed such that the chemical liquid is converted to a solid phase.

Afterwards, etchant E is discharged toward the center of the substrate W having the chemical liquid C coated thereon to remove the chemical liquid fixed to the particles under a chemical reaction with the particles P from the substrate W. Afterwards, rinse liquid R is discharged toward the center of the substrate W to rinse the substrate W. The substrate W from which the particles P have been removed through a drying process is transferred to be subjected to a subsequent process. During the cleaning process, the substrate W may continue to rotate.

In this regard, cleaning efficiency greatly depends on a chemical liquid filling ratio into the gap between the patterns T. In other words, the higher the chemical liquid filling ratio, the higher the cleaning efficiency. However, in the prior art, the filing rate inevitably decreases as the position is displaced toward the outer edge of the substrate W due to the above-mentioned physical phenomenon. This phenomenon causes nonuniform cleaning of the substrate W, which may lower a production yield of a semiconductor device.

Furthermore, the chemical liquid filling ratio is affected by the rotation speed of the substrate W. When the rotation speed is controlled to be lower than a certain speed, the chemical liquid C shrinks and thus may not fill a lower area of the gap between the patterns T. On the other hand, when the rotation speed of the substrate W is controlled to be higher than a certain speed, the chemical liquid C shrinks such that the chemical liquid C is concentrated at an inclined manner to fill the lower area of the gap between the patterns T. At this time, the filling ratio of about 60% may be achieved, while the shrinkage direction of the film made of the chemical liquid is biased to one side, thus making it difficult to remove the particles P in an empty space.

To solve this problem, in accordance with the present disclosure, provided is a substrate processing apparatus and a substrate processing method in which can remove the particles located deeply into the gap between the patterns by varying the rotation speed of the substrate W to high and low speeds during the chemical liquid coating process such that the pattern damage caused by physical or chemical substrate processing scheme may be minimized, and a difference between the chemical liquid filling ratios of the central and outer areas of the substrate may be reduced.

FIG. 1 is a schematic plan view showing a substrate processing facility according to an embodiment of the present disclosure.

Referring to FIG. 1, a substrate processing facility 10 includes an index module 100 and a process processing module 200. The index module 100 includes a load port 120 and a transfer frame 140. The load port 120, the transfer frame 140, and the process processing module 200 may be arranged sequentially. In the present disclosure, a direction in which the load port 120, the transfer frame 140, and the process processing module 200 are arranged is referred to as a first direction 12 (or, an x-axis direction). In a top view, a direction perpendicular to the first direction 12 is referred to as a second direction 14 (or a y-axis direction). A direction perpendicular to a plane (xy plane) including the first and second directions 12 and 14 is referred to as a third direction 16 (or a z-axis direction).

A carrier 130 receiving therein the substrate W is seated on the load port 120. A plurality of load ports 120 may be arranged along the second direction 14. The number of load ports 120 may increase or decrease depending on process efficiency and production efficiency of the process processing module 200. The carrier 130 may be embodied as a front opening unified pod (FOUP), and slots may be formed inside the carrier 130 so as to accommodate therein a plurality of substrates W in a level manner, respectively.

The process processing module 200 includes a buffer unit 220, a transfer housing 240, and a process housing 260. The transfer housing 240 may extend in a parallel manner to the first direction 12. The process housings 260 may be respectively disposed on both opposing sides in a length direction of the transfer housing 240. Furthermore, some of the process housings 260 may be arranged in a stacked manner. In one example, the process housings 260 may be disposed only on one side of the transfer housing 240.

The buffer unit 220 may be disposed between the transfer frame 140 and the transfer housing 240, and may provide a space in which the substrate W stays before being transferred between the transfer frame 140 and the transfer housing 240. A slot in which the substrate W is placed is formed inside the buffer unit 220. The buffer unit 220 may be configured to be opened or closed relative to the transfer frame 140 and the transfer housing 240.

The transfer frame 140 may transport the substrate W between the carrier 130 and the buffer unit 220. The transfer frame 140 is provided with an index rail 142 and an index robot 144. The index rail 142 may extend in a parallel manner to the second direction 14, and the index robot 144 may be installed on the index rail so that index robot may move thereon and along the second direction 14. The index robot 144 includes a base 144a, a body 144b, and an index arm 144c. The base 144a is installed to be movable along the index rail 142. The body 144b is coupled to the base 144a, and is installed on the base 144a so as to be movable along the third direction 16 and rotatable. The index arm 144c is coupled to the body 144b and is configured to move forward and backward with respect to the body 144b. A plurality of index arms 144c may be provided and may individually operate. Each index arm 144c may be used to transport the substrate W from the carrier 130 to the process processing module 200, or from the process processing module 200 to the carrier 130.

The transfer housing 240 transfers the substrate W between the buffer unit 220 and the process housing 260 or between the process housings 260. A guide rail 242 and a main robot 244 are provided in the transfer housing 240. The guide rail 242 may extend in a parallel manner to the first direction 12, and the main robot 244 is installed so as to be movable along the first direction 12. The main robot 244 includes a base 244a, a body 244b, and a main arm 244c. The base 244a is installed to be movable along the guide rail 242. The body 244b is coupled to the base 244a, and is installed on the base 244a so as to be movable along the third direction 16 and rotatable. The main arm 244c is coupled to the body 244b and is configured to move forward and backward with respect to the body 244b. A plurality of main arms 244c may be provided and may individually operate.

Figure 2:
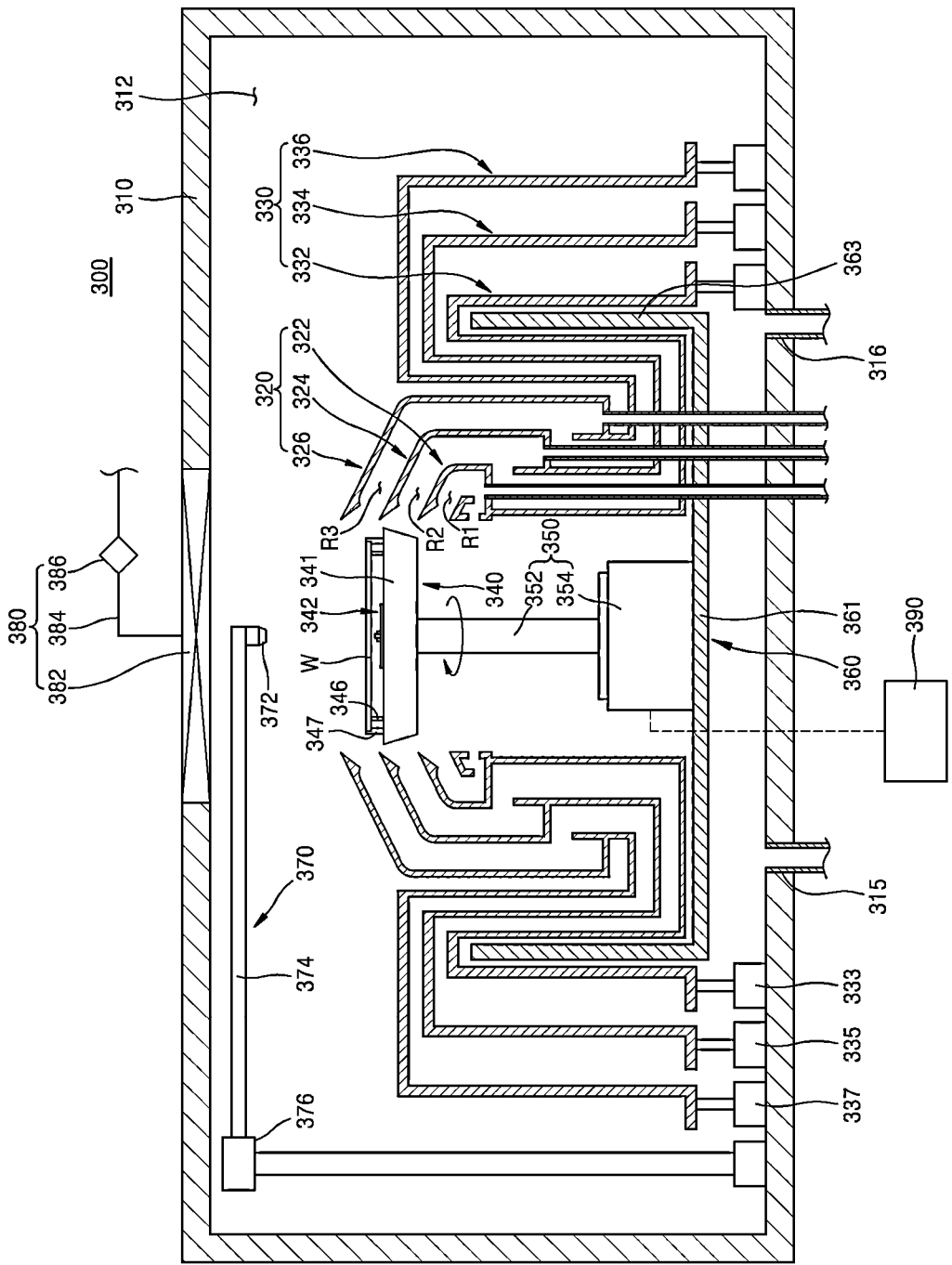
FIG. 2 is a schematic cross-sectional view showing a substrate processing apparatus according to an embodiment of the present disclosure.

The process housing 260 is provided with a substrate processing apparatus 300 [see FIG. 2] that performs a process on the substrate W. The substrate processing apparatus 300 may have a structure varying depending on a type of the process that the substrate processing apparatus 300 performs. In one example, the substrate processing apparatuses 300 in the process housings 260 may have the same structure, and the substrate processing apparatuses 300 in the process housings 260 belonging to the same group may have the same structure.

The substrate processing apparatus 300 [see FIG. 2] may perform a heating process to heat the substrate W and a cooling process to cool the substrate W. Additionally, the substrate processing apparatus 300 [see FIG. 2] may perform a cleaning process to perform liquid treatment on the substrate W. Furthermore, in the present disclosure, an example in which the substrate processing apparatus 300 is embodied as a coating apparatus or a cleaning apparatus is described. However, the present disclosure is not limited thereto. It should be noted that the substrate processing apparatus may also be embodied as a heating apparatus, an etching apparatus, and a photolithography apparatus.

FIG. 2 is a schematic cross-sectional view showing the substrate processing apparatus 300 according to an embodiment of the present disclosure.

The substrate processing apparatus 300 may be embodied as a coating apparatus for applying a photoresist on the substrate W, or may be embodied as a cleaning apparatus to clean the substrate W.

Referring to FIG. 2, the substrate processing apparatus 300 includes a housing 310, a processing container 320, a vertically-moving unit 330, a substrate support 340, a support driver 350, a base 360, a liquid ejector 370 and an air-flow supply 380.

The housing 310 provides an inner space. One side of the housing 310 has an opening (not shown) defined therein that may be used as a passage through which the substrate W is carried in and out. A door (not shown) is installed in the opening to open and close the opening. During a substrate processing process, the opening may be blocked such that the inner space of the housing 310 is sealed. Exhaust holes 315 and 316 may be formed in one side of the housing 310, so that air flow generated within the housing 310 may be exhausted to the outside.

The processing container 320 provides a space where the substrate processing process is performed. The processing container 320 has an open top. The processing container 320 includes a plurality of collection containers 322, 324, and 326. In one embodiment of the present disclosure, it is assumed that there are three (first, second, and third) collection containers 322, 324, and 326. However, the number of collection containers may be increased or decreased. The collection containers 322, 324, and 326 are provided to be spaced apart from each other along a vertical direction (or the third direction 16). Furthermore, the collection containers 322, 324, and 326 may be configured to be stacked up and down. The first collection container 322, the second collection container 324, and the third collection container 326 may respectively collect different processing liquids among the processing liquids used in the processes. The processing container 320 has at least one inlet R1, R2, and R3 arranged in the vertical direction (or third direction 16) into which the processing liquid that has completed the substrate processing may flow.

The first collection container 322 surrounds the substrate support 340, the second collection container 324 surrounds the first collection container 322, and the third collection container 326 surrounds the second collection container 324. Each of the collection containers 322, 324, and 326 is formed in an annular ring shape. A space R1 inside the first collection container 322, a space R2 between the first collection container 322 and the second collection container 324, and a space R3 between the second collection container 324 and the third collection container 326 may respectively functions as the inlets R1, R2, and R3 into which the processing liquid flows. Each collection pipe may extend from a bottom of each of the collection containers 322, 324, and 326 and thus may discharge the processing liquid flowing into each of the inlets R1, R2, and R3. The discharged processing liquid may be reused through an external processing liquid recovery system (not shown).

The vertically-moving unit 330 is coupled to the collection containers 322, 324, and 326 and raises and lowers the collection containers 322, 324, and 326. The vertically-moving unit 330 includes first to third vertically-moving units 332, 334, and 336. The first vertically-moving unit 332 is connected to the first collection container 322, the second vertically-moving unit 334 is connected to the second collection container 324, and the third vertically-moving unit 336 is connected to the third collection container 326. Each of the vertically-moving units 332, 334, and 336 may be connected to each of drive units 333, 335, and 337 and may receive a driving force for the vertical movement therefrom. The vertically-moving unit 330 may control a vertical level of each of the collection containers 322, 324, and 326 to adjust a size, a vertical level, and a position of each of the inlets R1, R2, and R3.

The substrate support 340 supports and rotates the substrate W thereon in the inner space 312 of the housing 310. The inner space 312 may be understood as a processing space for processing the substrate W. The substrate support 340 includes a rotatable support plate 341 and a fixed support plate 342.

The rotatable support plate 341 has a roughly circular upper edge in a top view. The rotatable support plate 341 is located outwardly of the fixed support plate 342. The rotatable support plate 341 is rotated by the support driver 350. A support pin 346 and a chuck pin 347 are provided on the rotatable support plate 341. The fixed support plate 342 has a roughly circular upper edge in a top view. The fixed support plate 342 is located in a central area of the substrate support 340.

The support driver 350 may rotate or vertically move the substrate support 340. The support driver 350 is connected to the rotatable support plate 341 of the substrate support 340. The support driver 350 includes a drive shaft 352 and a motor 354. The drive shaft 352 is rotated by the motor 354 to cause the rotatable support plate 341 to rotate. Furthermore, a vertical level of the substrate support 340 may be adjusted by moving or expanding or contracting the drive shaft 352 in the vertical direction under the operation of the motor 354.

The base 360 surrounds the processing container 320 and is provided in a cylindrical shape with an open top. The base 360 includes a bottom 361 and a wall 363. The base 360 is provided in a cup shape. The bottom 361 may be provided in a disk shape and an exhaust pipe 365 may be connected to the bottom 361. The wall 363 extends in a vertical direction from a side end of the bottom 361. The base 360 may be made of a highly acid-resistant resin material. The base 360 functions as substantially an entire outer wall of the processing container 320.

The liquid ejector 370 (or a front liquid ejector 370) supplies the processing liquid to the substrate W during the substrate processing process. The liquid ejector 370 supplies the processing liquid to a front surface of the substrate W. The liquid ejector 370 may be composed of a nozzle 372 capable of supplying the processing liquid, and a pipe 374. One end of the liquid ejector 370 is connected to a chemical liquid supply apparatus (not shown). A bubble removal pipe 376 is connected to a portion of the pipe 374 so as to remove bubbles remaining in the processing liquid.

In one example, the processing liquid such as a photoresist liquid may be ejected from the nozzle 372 provided in the liquid ejector 370 and may be coated on the front surface of the substrate W. In another example, an organic solvent such as the chemical liquid IPA may be ejected from the nozzle 372 provided in the liquid ejector 370 to clean or dry the front surface of the substrate W.

The air-flow supply 380 may generate a downward air-flow in the inner space of the housing 310. The air-flow supply 380 includes a fan 382, an air-flow supply line 384, and a filter 386. The fan 382 is installed at a top of the housing 310 so as to generate the downward air-flow in the inner space of the housing 310. The air-flow supply line 384 supplies an external air to the housing 310. The filter 386 filters impurities included in the air.

The exhaust holes 315 and 316 are connected to a gas exhaust apparatus (not shown). Each of the exhaust holes 315 and 316 is connected to a main exhaust line (not shown) of the gas exhaust apparatus (not shown). Furthermore, the exhaust holes 315 and 316 of the plurality of substrate processing apparatus 300 may be respectively connected to the main exhaust line (not shown) of the gas exhaust apparatus (not shown). FIG. 2 shows two exhaust holes 315 and 316. However, the number of exhaust holes may be increased or decreased depending on the type of the chemical liquid, the type of a process by-product, etc. Each exhaust hole may be connected to the main exhaust line of the gas exhaust apparatus (not shown).

The substrate processing apparatus 300 may further include a controller 390, which controls the substrate processing apparatus 300 to process the substrate W according to a process order.

The controller 390 may repeatedly apply a first rotation control signal and a second rotation control signal indicating different rotation speeds to the substrate support 340 so as to generate an inertial behavior of the chemical liquid coated on the substrate W due to change in a rotation speed of the substrate support 340 in a process of coating the chemical liquid on the substrate W.

The controller 390 may apply the first rotation control signal thereto to allow the substrate support 340 to rotate at a first rotation speed, and may apply the second rotation control signal thereto while the rotation of the substrate support 340 is not stopped to allow the substrate support 340 to rotate at a second rotation speed different from the first rotation speed.

Furthermore, the controller 390 may be configured to periodically and repeatedly apply the first rotation control signal and the second rotation control signal at a regular interval. In this regard, a difference between the first rotation speed and the second rotation speed may in a range of 500 rpm to 750 rpm. The first rotation speed may be in a range of 1500 rpm to 2000 rpm, and the second rotation speed may be in a range of 750 rpm to 1500 rpm.

Furthermore, the controller 390 may apply the first rotation control signal for a first time and then apply the second rotation control signal for a second time. For example, the first time and the second time may have the same value. In one example, each of the first time and the second time may be in a range of 1 second to 5 seconds.

Hereinafter, a substrate processing method using the substrate processing apparatus 300 as described above will be described in detail with reference to FIG. 3 to FIG. 5.

Figure 3:
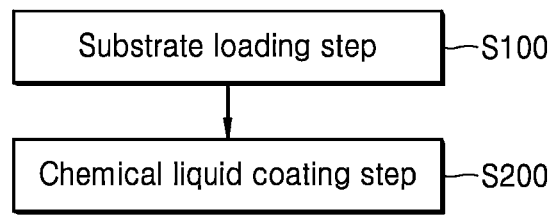
FIG. 3 is a flowchart schematically showing a substrate processing method according to an embodiment of the present disclosure.
Figure 4:
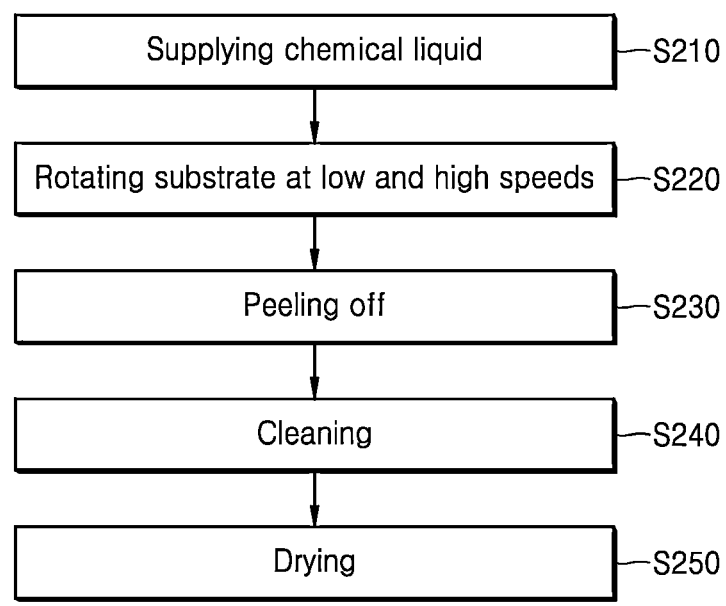
FIG. 4 is a flowchart for illustrating, in detail, a chemical liquid coating step as shown in FIG. 3.

FIG. 3 is a flowchart schematically showing the substrate processing method according to an embodiment of the present disclosure, and FIG. 4 is a flowchart for illustrating, in detail, a chemical liquid coating step S200 as shown in FIG. 3. FIG. 5 is a cross-sectional view schematically shown to illustrate the substrate processing method according to an embodiment of the present disclosure.

First, referring to FIG. 3, the substrate processing method according to an embodiment of the present disclosure includes a substrate loading step S100 and the chemical liquid coating step S200. The substrate processing method may use the substrate processing apparatus 300 as described above and may include the substrate loading step in which the substrate W is loaded and supported on the substrate support 340 in the processing space 312 of the housing 310.

The substrate loading step S100 may include a substrate moving step in which the substrate W is moved so that the substrate W is accommodated in the housing 310 using a moving unit. For example, the moving unit may be configured to move in the vertical direction, a left and right direction, or all directions.

Generally, when cleaning the substrate W using the chemical liquid C based on a polymer solution, the chemical liquid C may not sufficiently penetrate into the space between the fine patterns T formed on the substrate W.

For this reason, in accordance with the present disclosure, as shown in FIG. 4, after the substrate W has been loaded into the housing 310, the chemical liquid coating step S200 may be performed in which the chemical liquid C is sprayed on one surface of the substrate W, and then, the substrate W is rotated while varying the rotation speeds of the substrate W.

First, after the substrate W has been loaded onto the housing 310, a step S210 of supplying the chemical liquid C on the substrate W may be performed. The chemical liquid C may be supplied thereto through the nozzle 372 of the liquid ejector 370. A certain amount of the chemical liquid C may be sprayed on the substrate W. The amount of the chemical liquid C may be controlled to vary depending on a size of the substrate W and the type of the chemical liquid C.

The chemical liquid supply step S210 may include a chemical liquid supply step in which the chemical liquid C is supplied from a chemical liquid supply source 339-370 through a pump, and a chemical liquid transfer step in which the supplied chemical liquid C is transferred to an nozzle 372 through a chemical liquid supply line. For example, the chemical liquid supply step may include a chemical liquid control step in which the amount of the chemical liquid Cis adjusted before the chemical liquid C is supplied from the chemical liquid supply source 370. In this way, a volume of a heat transfer medium M may be reduced by applying the chemical liquid C with a relatively lower temperature than that of the heat transfer medium M onto the substrate W.

When applying the chemical liquid C, the substrate W may be rotated under the rotation of the substrate support 340. In this regard, the rotation of the substrate W may be performed simultaneously with the application of the chemical liquid C. This is because when the substrate W is rotated before the chemical liquid C is applied while the temperature of the substrate W is elevated, the temperature may be lowered due to the rotational force of the substrate W. In accordance with the present disclosure, a step S220 of rotating the substrate W at different rotation speeds may be performed after the chemical liquid C has been sprayed on the substrate W.

For example, the controller 390 may apply the first rotation control signal to the substrate support to allow the substrate support 340 to rotate at the first rotation speed, and may apply the second rotation control signal to the support substrate while the rotation of the substrate support 340 is not stopped to allow the substrate support 340 to rotate at the second rotation speed different from the first rotation speed.

Furthermore, the controller 390 may be configured to periodically and repeatedly apply the first rotation control signal and the second rotation control signal at a regular interval. In this regard, the difference between the first rotation speed and the second rotation speed may in a range of 500 rpm to 750 rpm. Preferably, the difference between the first rotation speed and the second rotation speed may be maintained at 550 rpm to 650 rpm.

When the difference between the first rotation speed and the second rotation speed is lower than 500 rpm, the chemical liquid penetration effect required in the present disclosure may be significantly reduced. On the contrary, when the difference exceeds 750 rpm, the difference in the rotation speed increases such that the chemical liquid may be quickly dried and solidified during the coating process, and thus, the chemical liquid C may not be properly coated on the substrate W.

Furthermore, the first rotation speed may be controlled to be maintained at 1500 rpm to 2000 rpm, and the second rotation speed may be controlled to be maintained at 750 rpm to 1500 rpm. When the rotation speed of the substrate W exceeds 2000 rpm, the solidification quickly progresses such that there is insufficient time for the chemical liquid to penetrate into the gap between the patterns. On the contrary, when the substrate W is rotated at a speed lower than 750 rpm, it becomes difficult for the chemical liquid to flow under the centrifugal force, such that the chemical liquid C may not be coated on the outer area of the substrate W.

Therefore, both the first rotation speed and the second rotation speed may be adjusted to be within the range of 750 rpm to 2000 rpm. In order to induce the inertial behavior of the chemical liquid C, the speed difference of a certain value is required. To this end, the first and second rotation speeds should be controlled to be in the above range. Preferably, each of the first rotation speed and the second rotation speed may be controlled to be within a range of 800 rpm to 1800 rpm.

Furthermore, the controller 390 may apply the first rotation control signal for a first time and then apply the second rotation control signal for a second time. For example, the first time and the second time may have the same value. In one example, each of the first time and the second time may be in a range of 1 second to 5 seconds.

Specifically, during the chemical liquid coating process, the rotation speed of the substrate W may be changed from a high speed to a low speed or from a low speed to a high speed, such that the chemical liquid C may invade and fill the gap between the patterns T formed on the substrate W.

Figure 5:
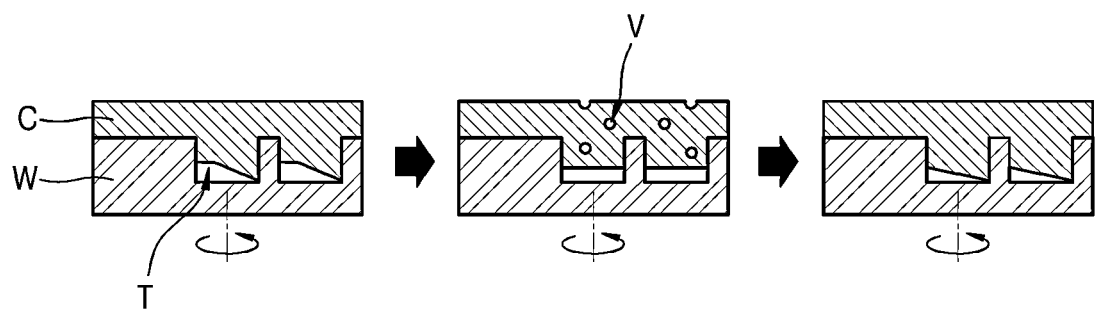
FIG. 5 is a cross-sectional view for schematically illustrating a substrate processing method according to an embodiment of the present disclosure.

In one example, referring to a left drawing of FIG. 5, the substrate W may be rotated by controlling the substrate support 340 to rotate at the first rotation speed at the same time as when the chemical liquid C is sprayed on the substrate W. In this regard, under rotational acceleration, the chemical liquid C may be brought into close contact with a wall of the pattern T formed on the substrate W.

Afterwards, the rotation speed of the substrate W may be lowered down by controlling the substrate support 340 to rotate at the second rotation speed that is relatively lower than the first rotation speed without stopping the rotation of the substrate W. Referring to a middle drawing of FIG. 5, as the rotation speed of the substrate W is lowered down, the inertial behavior of the chemical liquid C applied on the substrate W is generated, thereby causing a gas V existing in the chemical liquid P to be discharged to the outside. In this regard, a lower area of the gap between the patterns T may be filled with the chemical liquid C by an amount equal to the amount of the discharged gas V.

In this regard, the inertial behavior may refer to a behavior in which an object maintains a movement state of the object unless an external force is applied thereto. In the inertial behavior, the chemical liquid C which is flowing quickly along the rotation direction of the substrate W is subjected to a force in a direction relatively opposite to the rotation direction of the substrate W as the rotation speed of the substrate W is lowered down.

Referring to a drawing on the right of FIG. 5, when the substrate W which is rotated at the second rotation speed is controlled to be rotated at the first rotation speed higher than the second rotation speed, the chemical liquid C contacts closely the wall of the pattern T due to the rotational acceleration of the substrate W such that the chemical liquid C may further deeply invade the gap between the patterns T.

A process of rotating the substrate W for a predetermined time at the first rotation speed and then rotating the same for a predetermined time at the second rotation speed lower than the first rotation speed is defined as one unit cycle. The unit cycle may be repeated at least two times to improve the chemical liquid penetration percentage into the gap between the patterns T to a value equal to or greater than 70%.

In another example, in order to further improve the inertial behavior of the chemical liquid C on the substrate W, the controller 390 may rotate the substrate W at the first rotation speed, then change the rotation speed thereof to the second rotation speed, and then change the same not to the first rotation speed but to a third rotation speed that is higher than the first rotation speed. Then, the rotation speed of the substrate W is reduced not to the second rotation speed but to a fourth rotation speed that is lower than the second rotation speed. In this regard, a difference between the third rotation speed and the fourth rotation speed may be controlled to be in a range of 500 rpm to 750 rpm.

In another example, the rotation speed of the substrate W may be changed from the first rotation speed to the second rotation speed which is lower than the first rotation speed, and then may be changed from the second rotation speed to the third rotation speed which is higher than the first rotation speed, and then may be changed from the third rotation speed to the second rotation speed.

That is, the first rotation speed and the third rotation speed may be controlled to be different from each other. The second rotation speed and the fourth rotation speed may be controlled to be different from each other. Alternatively, the first rotation speed and the third rotation speed may be controlled to be equal to each other. The second rotation speed and the fourth rotation speed may be controlled to be equal to each other. The range of the rotation speeds may be appropriately adjusted under control of a rotation driver for the substrate support 340 provided in the substrate processing apparatus 300.

Referring again to FIG. 4, in order to remove the particles physically attached to a portion of the substrate, a step S230 of peeling off the chemical liquid C coated on the substrate W may be performed after the coating step S220 in which the chemical liquid C is applied on the substrate W while repeatedly rotating the substrate W at high and low speeds. The chemical liquid C may be peeled off while the etchant E is ejected to the center of the substrate W.

Afterwards, a step S240 of cleaning the substrate W may be performed while a rinse liquid is ejected to the center of the substrate W, and then, a step S250 of drying the cleaned substrate W may be performed. In this regard, while the substrate W continues to rotate without stopping the rotation of the substrate W while the peeling process S230, the cleaning process S240, and the drying process S250 are performed.

Hereinafter, Examples are described to aid understanding of the present disclosure.

However, the following experimental examples are only intended to help understand the present disclosure, and the present disclosure is not limited to the examples below.

In a present example of the present disclosure, after spraying the chemical liquid on the substrate W, the substrate W was rotated at 1800 rpm for 5 seconds and then at 1100 rpm for 5 seconds, and this process was repeated three times, such that the chemical liquid C was coated on the substrate W. Afterwards, the chemical liquid penetration percentage into the gap between the patterns T and the particle removal percentage of the particle P attached to the substrate W were tested. On the other hand, in a comparative example of the present disclosure for comparison, after spraying the same chemical liquid on the substrate W, the substrate W was rotated at 1500 rpm for 30 seconds such that the chemical liquid C was coated on the substrate W. Afterwards, the chemical liquid penetration percentage into the gap between the patterns T and the particle removal percentage of the particle P attached to the substrate W were tested in the same manner.

Figure 6:
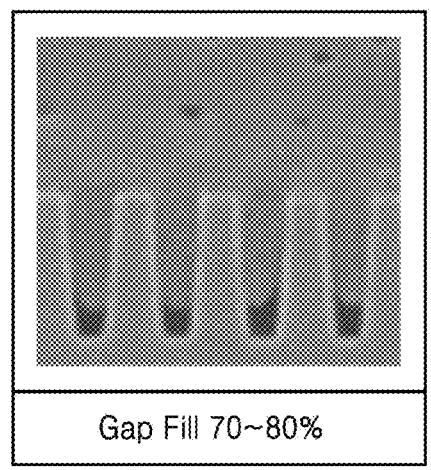
FIG. 6 to FIG. 8 are images showing results of removing particles attached to a substrate therefrom using a substrate processing method according to a present example of the present disclosure.
Figure 7:
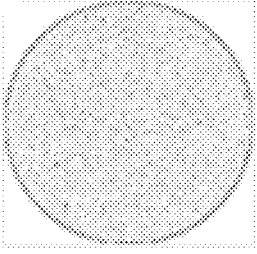
Figure 7:
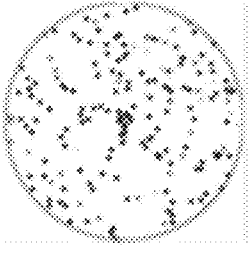
Figure 8:
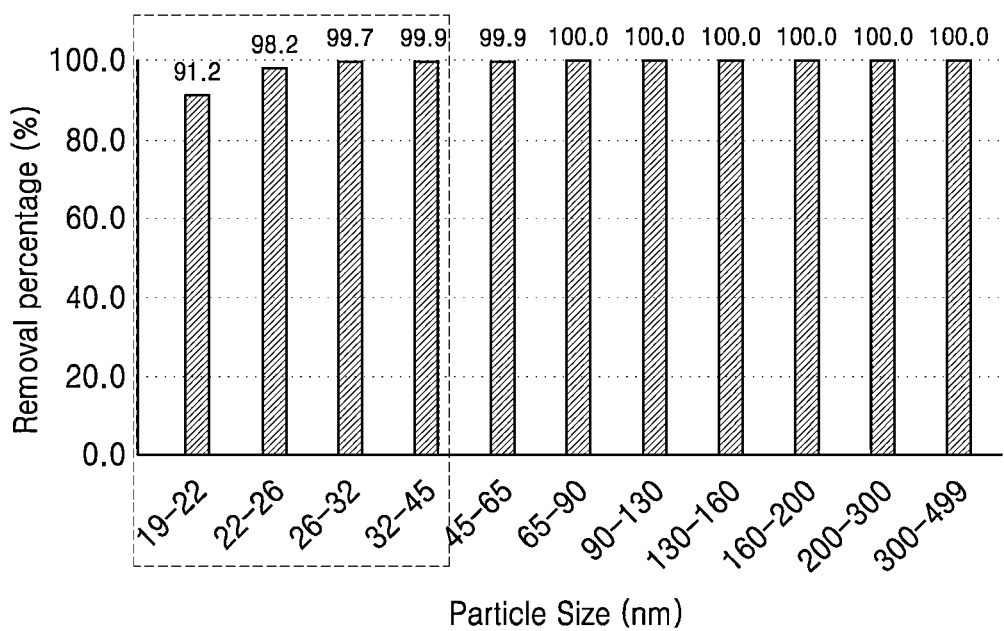
Figure 9:
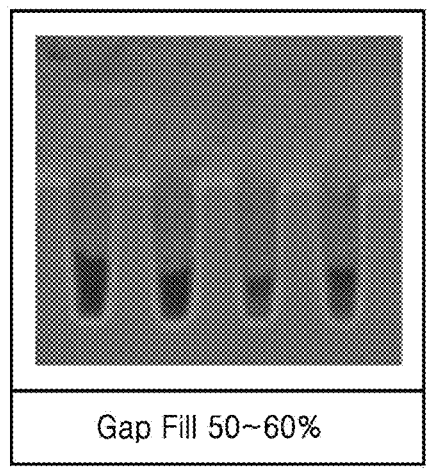
Figure 11:
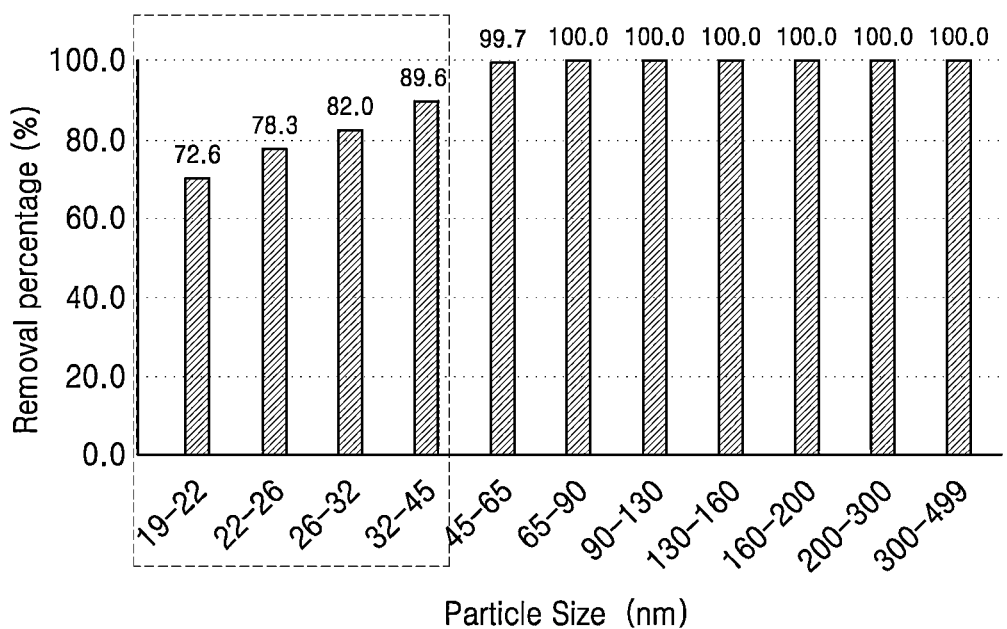

FIG. 6 to FIG. 8 are images showing the results of removing the particles attached to the substrate therefrom using the substrate processing method according to the present example of the present disclosure. FIG. 9 to FIG. 11 are images showing the results of removing the particles attached to the substrate therefrom using the substrate processing method according to the comparative example in the present disclosure.

First, referring to FIG. 6 to FIG. 8, it was identified that in the present example sample of the present disclosure, the chemical liquid penetration percentage into the gap between the patterns T satisfied a range of 70% to 80%. In addition, it was identified that the resulting particle P removal percentage was as high as 99%. In particular, it was identified that as the particle P removal percentage of the particle having a size smaller than or equal to 45 nm increased, an effect of varying the rotation speed of the substrate W was significant.

On the other hand, referring to FIG. 9 to FIG. 11, it was identified that in the comparative example sample of the present disclosure, the chemical liquid penetration percentage into the gap between the patterns T satisfied a range of 50% to 60%. In addition, it was identified that the resulting particle P removal percentage was 94%, which was lower than that of the present example sample of the present disclosure. It was identified that most of the particles P with a size exceeding 45 nm were removed, while the particles P of a size smaller than or equal to 45 nm, the particles re-adsorbed to the pattern during the process, and polymer residues due to lack of the peeling effect remained on the substrate W.

Therefore, according to the embodiment of the present disclosure, during the cleaning process using the coating process of a curable polymer chemical liquid, repeatedly switching the rotation speed of the substrate W to between the high and low speeds may result in the generating of the inertial behavior of the chemical liquid, such that the gases existing in the gap between the patterns are removed, thereby improving the chemical liquid penetration percentage and thus effectively cleaning the substrate.

The present disclosure has been described with reference to the embodiments shown in the drawings. However, this is merely illustrative, and those skilled in the art will understand that various modifications and equivalent further embodiments may be made thereto. Therefore, the true scope of the present disclosure should be determined based on the technical spirit of the attached patent claims.

What is claimed is:

1. A substrate processing apparatus comprising:
   a housing having a processing space defined therein in which a substrate is processed;
   a substrate support installed in the processing space so as to be rotatable about a rotation axis and configured to support the substrate;
   a chemical liquid supply disposed on top of the substrate support and configured to spray a chemical liquid toward an upper surface of the substrate supported on the substrate support, the chemical liquid including a volatile component; and
   a controller configured to control the chemical liquid supply to spray the chemical liquid toward the upper surface of the substrate, and then repeatedly apply a first rotation control signal indicating a first rotation speed and a second rotation control signal indicating a second rotation speed to the substrate support in a process of coating the chemical liquid on the substrate, thereby volatilizing the volatile component in the chemical liquid to convert the chemical liquid into a solid film on the substrate,
   wherein the first rotation speed is between 1500 rotations per minute (rpm) and 1800 rpm, and the second rotation speed is between 750 rpm and 1500 rpm and being 500 rpm to 750 rpm less than the first rotation speed.

2. The substrate processing apparatus of claim 1, wherein the controller is configured to:
   apply the first rotation control signal to the substrate support to allow the substrate support to rotate at the first rotation speed; and
   apply the second rotation control signal to the substrate support while the rotation of the substrate support is not stopped to allow the substrate support to rotate at the second rotation speed.

3. The substrate processing apparatus of claim 1, wherein the controller is configured to repeatedly apply the first rotation control signal and the second rotation control signal at a regular interval.

4. The substrate processing apparatus of claim 1, wherein the controller is configured to apply the first rotation control signal for a first time, and then apply the second rotation control signal for a second time.

5. The substrate processing apparatus of claim 4, wherein the first time and the second time are equal to each other.

6. The substrate processing apparatus of claim 4, wherein each of the first time and the second time is in a range of 1 second to 5 seconds.

7. The substrate processing apparatus of claim 1,
   wherein the chemical liquid supply is configured to spray an etchant toward the upper surface of the substrate,
   the controller is configured to control the chemical liquid supply to spray the etchant toward the upper surface of the substrate to remove the solid film.

8. The substrate processing apparatus of claim 7, wherein
   the chemical liquid supply is configured to spray a rinse liquid toward the upper surface of the substrate,
   the controller is configured to control the chemical liquid supply to spray the rinse liquid toward the upper surface after the etchant has been sprayed.

9. The substrate processing apparatus of claim 4, wherein the volatile component volatilizes during the second time.

10. A substrate processing method using a substrate processing apparatus, wherein the substrate processing apparatus includes:
    a housing having a processing space defined therein in which a substrate is processed;
    a substrate support installed in the processing space so as to be rotatable about a rotation axis and configured to support the substrate;
    a chemical liquid supply disposed on top of the substrate support and configured to spray a chemical liquid toward an upper surface of the substrate supported on the substrate support, the chemical liquid including a volatile component; and
    a controller configured to control the chemical liquid supply to spray the chemical liquid toward the upper surface of the substrate, and then repeatedly apply a first rotation control signal indicating a first rotation speed and a second rotation control signal indicating a second rotation speed to the substrate support in a process of coating the chemical liquid on the substrate, thereby volatilizing the volatile component in the chemical liquid to convert the chemical liquid into a solid film on the substrate,
    wherein the first rotation speed is between 1500 rotations per minute (rpm) and 1800 rpm, and the second rotation speed is between 750 rpm and 1500 rpm and being 500 rpm to 750 rpm less than the first rotation speed,
    wherein the method comprises:

a substrate loading step in which the substrate is loaded onto and supported on the substrate support in the processing space of the housing; and a chemical liquid coating step of spraying the chemical liquid toward the upper surface of the substrate and coating the chemical liquid on the substrate by rotating the substrate while changing a rotation speed of the substrate between the first rotation speed and the second rotation speed.

11. The substrate processing method of claim 10, wherein the chemical liquid coating step includes:

applying the first rotation control signal to the substrate support to allow the substrate support to rotate at the first rotation speed; and applying the second rotation control signal to the substrate support while the rotation of the substrate support is not stopped to allow the substrate support to rotate at the second rotation speed.

12. The substrate processing method of claim 10, wherein the chemical liquid coating step includes repeatedly applying the first rotation control signal and the second rotation control signal at a regular interval.

13. The substrate processing method of claim 10, wherein the chemical liquid coating step includes applying the first rotation control signal for a first time, and then applying the second rotation control signal for a second time.

14. The substrate processing method of claim 13, wherein the first time and the second time are equal to each other.

15. The substrate processing method of claim 13, wherein each of the first time and the second time is in a range of 1 second to 5 seconds.

16. The substrate processing method of claim 10, further comprising:

peeling off the solid film on the substrate to remove particles physically attached to an area of the substrate; and cleaning the substrate from which the solid film has been peeled off, and drying the cleaned substrate.

17. A substrate processing apparatus comprising:

a housing having a processing space defined therein in which a substrate is processed;

a substrate support installed in the processing space so as to be rotatable about a rotation axis and configured to support the substrate;

a chemical liquid supply disposed on top of the substrate support and configured to spray a chemical liquid toward an upper surface of the substrate supported on the substrate support, the chemical liquid including a volatile component and a curable polymer, wherein volatilizing the volatile component converts the chemical liquid into a solid film; and a controller configured to control the chemical liquid supply to spray the chemical liquid toward the upper surface of the substrate, and then repeatedly apply a first rotation control signal indicating a first rotation speed and a second rotation control signal indicating a second rotation speed to the substrate support in a process of coating the chemical liquid on the substrate, wherein the first rotation speed is between 1500 rotations per minute (rpm) and 1800 rpm, and the second rotation speed is between 750 rpm and 1500 rpm and being 500 rpm to 750 rpm less than the first rotation speed.

* * * * *